United States Patent [19]

Cole

[11] Patent Number: 4,622,692
[45] Date of Patent: Nov. 11, 1986

[54] NOISE REDUCTION SYSTEM
[75] Inventor: William A. Cole, Mossley, Canada
[73] Assignee: Linear Technology Inc., Burlington, Canada
[21] Appl. No.: 659,480
[22] Filed: Oct. 10, 1984
[30] Foreign Application Priority Data
Oct. 12, 1983 [CA] Canada .................................. 438781
[51] Int. Cl.4 .......................................... H04R 25/00
[52] U.S. Cl. ..................... 381/94; 381/107; 381/108; 381/68
[58] Field of Search ................ 381/94, 106, 107, 108, 381/122, 56, 61, 68; 179/81 B, 100 L

[56] References Cited
U.S. PATENT DOCUMENTS
3,818,149 6/1974 Stearns et al. ..................... 381/68 X OTHER PUBLICATIONS
van den Brink, "Improved DNL", Elektor, Jul., Aug. 1979, pp. 7-08-7-09.

Primary Examiner—James L. Dwyer
Attorney, Agent, or Firm—Rogers, Bereskin & Parr

[57] ABSTRACT

Electronic circuitry as described which enhances the intelligibility of a speech signal corrupted by low-frequency noise while tending to retain frequency components of the signal characteristic of natural-sounding speech. The circuitry includes a broad band channel which passes the speech signal with little spectral distortion. A high-pass channel produces a high-pass signal corresponding to high-frequency components of the speech signal, components which in themselves provide the human ear with considerable information for discernment of different sounds. An operational amplifier in a summing configuration combines the broadband and high-pass signals to produce a processed speech signal with enhanced intelligibility. Gain control circuitry associated with the high-pass channel reduces gain in the high-pass channel with increasing intensity of high-frequency speech signal components thereby tending to enhance the speech signal to an increasing degree at low signal levels and to otherwise produce a processed speech signal suitable for reproduction of natural-sounding speech.

2 Claims, 3 Drawing Figures 4,622,692

NOISE REDUCTION SYSTEM

FIELD OF THE INVENTION

The invention relates generally to noise reduction systems and more particularly to methods and apparatus for enhancing the intelligibility of speech signals containing low-frequency noise.

BACKGROUND OF THE INVENTION

Electronic noise reduction systems have the general object of removing unwanted noise from signals containing useful information. Simple noise reduction systems commonly use filters to attenuate noise expected to reside primarily in certain definable frequency bands. The successful use of such a system depends in large measure on how different the frequency components of the signal and noise are. Very often, the signal and noise will have overlapping spectra, and such a noise reduction system will tend to alter the spectral characteristics of the desired signal. In more sophisticated noise reduction systems, the general object has been to increase the signal-to-noise ratio without significantly distorting the characteristics of the desired signal.

In the reproduction of music, high-frequency noise such as tape hiss has been a problem. A system has been proposed for reducing such high-frequency noise without pre-processing source signals and without unduly impairing the effective frequency response of the associated sound reproduction system. In the proposed noise reduction system, the desired signal is processed by a dynamic low-pass filter whose corner or cut-off frequency can be varied during operation. To ensure high fidelity sound reproduction, the cut-off frequency is varied in response to the detected instensity of high-frequency signal components, the pass-band of the filter being expanded to accommodate the frequency content of the incoming signal and otherwise restricted to reduce reproduction of high-frequency noise. Such a system is described in an article entitled "On-Chip Stereo Filter Cuts Noise Without Pre-processing Signals" by Martin Giles, in Electronics, Aug. 11, 1981 P.104.

An analogous approach has been proposed in hearing aid applications in which low-frequency noise is a common problem. In the proposed system, a signal channel containing a dynamic high-pass filter with a variable cut-off frequency is provided. A control path is provided which includes a low-pass filter, rectifier and smoothing filter, which produce a DC voltage indicative of the intensity or strength of the low-frequency signal components, ideally noise components. This voltage is applied to the high-pass filter in the signal channel to control filter bandwidth. When low-frequency noise is detected, the pass-band of the filter is restricted, ideally attenuating the noise. Such a system is described in an article entitled "Automatic Noise Suppression in Hearing Aids", by S. Iwasaki, in the Hearing Aid Journal, December 1981, P.10. There are two basic problems with such a system. First, low-level speech signals may be obscured by noise at a low-level insufficient to cause restriction of the bandwidth of the high-pass filter. Second, to prevent restriction of filter band width in response to low-frequency components of the male voice, the low-pass filter in the control channel must be restricted to a pass only frequencies below 100 Hz. With such a requirement imposed on the low-pass filter, the system works well only with very low-frequency noise. The alternative is to allow normal operation of the highpass filter with a more restricted band width, resulting in reproduced speech with a "tinniness" which is unpleasant to the human ear and which lacks most of the distinctive qualities of the speaker's voice. More elaborate noise reduction systems have been proposed which involve a multiplicity of computer-control filters in the signal channel. The associated computer analyzes the frequency of the temporal characterisitics of the desired signal to determine if noise is present. When noise is detected, the associated computer adjusts the filters using an iterative technique until the noise of the output of the filters is minimized. Such a system works extremely well if the algorithms are sophisticated enough to reliably differentiate between speech and noise and if a sufficient number of filters is provided. The major disadvantages of such an approach are size, cost, complexity and power consumption.

It is an object of the present invention to provide method and apparatus for enhancing the intelligibility of speech signals containing low-frequency noise devoid of many of the drawbacks associated with prior art noise reduction systems. Various objects and advantages of the invention will be described in greater detail below.

BRIEF SUMMARY OF THE INVENTION

In a first aspect the invention provides apparatus for enhancing the intelligibility of an electric speech signal corrupted with low-frequency noise. The apparatus includes a broadband channel which produces from the speech signal a corresponding broadband signal, that is, a signal having substantially the same spectral distribution of signal components as does the speech signal. The broadband channel may typically be a simple feedforward channel, an amplifier for practical purposes having an effectively infinite bandwidth, a high-pass filter with a very low cut-off frequency or any other device which effectively passes the speech signal without significant distortion of spectral components. A high-pass channel is provided to produce from the speech signal a high-pass signal corresponding to a high-frequency band of the speech signal. Gain regulating means vary the gain of the high-pass channel inversely with the intensity of the high-frequency band. Combining means produce an output signal corresponding to a combination of the broadband and high-pass signals, which combination is preferably a simple summation or weighted summation of the two signals.

In essence, the braodband signal provides at the output the full frequency content of the speech signal. The high-pass channel effectively adds to the broadband signal to varying degrees high-frequency components of the speech signal which in themselves convey much of the information required by a listener to discern different sounds in the associated speech. The addition of the high-frequency content does tend to alter the natural qualities of the speech embodied by the broadband signal. However, the gain control provided in the highpass channel effectively limits the addition of high-frequency content when the speech signal appears to be at a relatively high level, as gauged by the intensity of its high-frequency content. When the speech signal is at a relatively low level, with the possibility of being obscured by low-frequency background noise, the gain control effectively adds to the broadband signal increasing amounts of high-frequency content to ensure better intelligibility of the processed speech signal.

The invention also involves a method which is effectively embodied by the apparatus.

DESCRIPTION OF THE DRAWINGS

The invention will be better understood with reference to drawings in which.

DETAILED DESCRIPTION OF INVENTION AND PREFERRED EMBODIMENT

Figure 1:
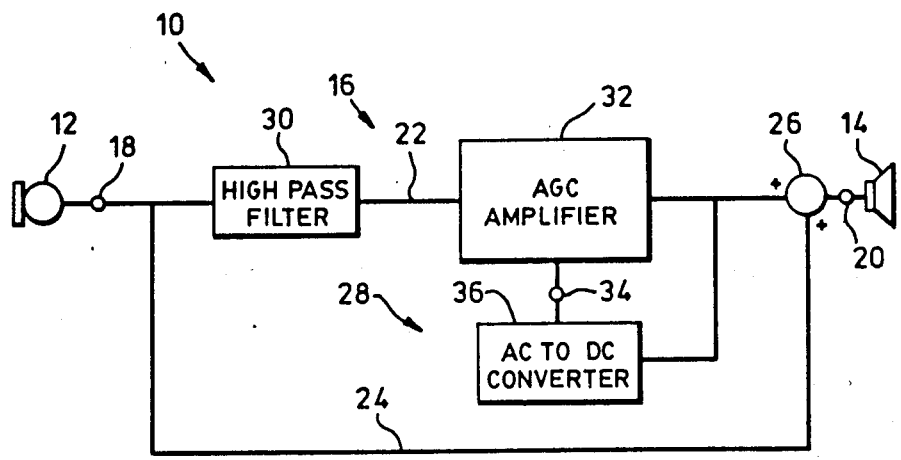
FIG. 1 is a block diagram representation of apparatus embodying the invention.

FIG. 1 illustrates a system 10 for reproducing speech, as for example, an intercom or surveillance system. The system 10 includes a microphone 12 for producing an audio-frequency electric speech signal representing speech sounds incident upon the microphone 12, a speaker 14 to which a processed speech signal is delivered for audible reproduction, and an electronic circuit 6, with an input terminal 18 and an output terminal 20, which serves to enhance the intelligibility of the speech signal in the presence of low-frequency noise.

The circuitry 16 has a high-pass channel 22, a broadband channel 24 and a summer 26 which serves to combine signals received from the high-pass and broadband channels. The summer 26 will typically be an operational amplifier in a summing configuration. Gain setting circuitry regulates the gain in the high-pass channel 22.

The high-pass channel 22 includes a high-pass filter 30 with a 4,000 Hz cut-off frequency which attenuates low-frequency signal components. In many environments, such as shopping malls, restaurants and train stations, the low-frequency noise which commonly accompanies a speech signal is likely to have most of its spectral energy concentrated below about 1,000 Hz. The high-pass filter signal is amplified by an automatic gain control (AGC) amplifier 32 to produce an amplified signal which serves as the high-pass signal described above. The gain of the AGC amplifier 32 can be set at different levels by applying an appropriate voltage signal to an amplifier control terminal 34.

Gain of the AGC amplifier 32 is set by the output voltage of an AC-to-DC converter which responds to the output signal of the AGC amplifier 32. The output signal of the AGC amplifier 32 corresponds to high-frequency components of the speech signal which are passed by the high-pass filter 30. The voltage generated by the converter 36 is consequently indicative of the intensity of the high-frequency components of the speech signal. As the voltage generated by the converter 36 increases, indicating greater high-frequency spectral content in the speech signal, the gain of the AGC amplifier 32 is progressively reduced. As will be apparent, the gain setting in the AGC amplifier 32 involves a feedback arrangement in which gain is adjusted in response to the level of the amplifier output signal. A feedforward arrangement in which the converter 36 responds to the high-pass filtered signal directly can also be implemented. However, a feedforward arrangement is not preferred because of the attendant difficulty in predictably setting the gain of the AGC amplifier 32.

Figure 2:
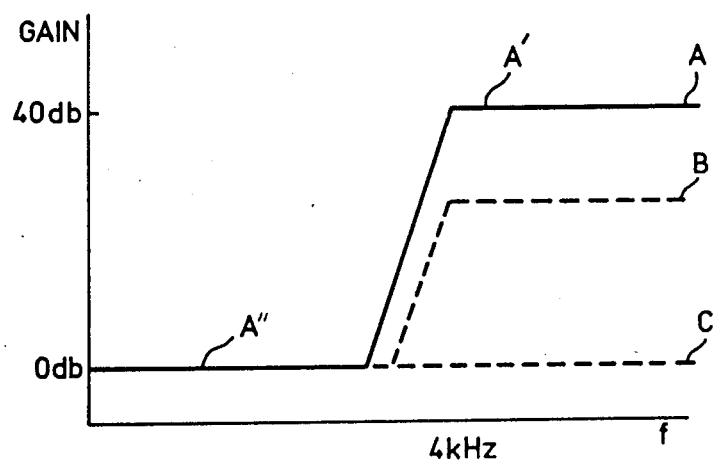
FIG. 2 is a graph illustrating the gain characteristics of the apparatus of FIG. 1.

The broadband channel 24 is simply a feed-forward line which conducts the speech signal directly to the summer 26. An amplifier could be provided in the broadband channel 24, but this would only introduce redundant circuit components as gain for the broadband channel can effectively be provided by the summer 26. In fact, the summer can be used to adjust the relative gain of the high-pass and broadband channels 22, 24. Operation of the circuit 16 will be better understood with reference to FIG. 2 which graphically illustrates the gain in decibels between the output terminal 20 and input terminal 18 as a function of frequency (indicated on the horizontal axis by the letter "f"). The curve A in solid outline represents gain of the circuit 16 when the intensity of the high-frequency components of a speech signal are below a level determined by combined operation of the converter 36 and AGC amplfier 32. The curve portion A' represents essentially the contribution to the gain transfer function of the high-pass channel 22 (neglecting the unity gain associated with the broadband channel 24). The curve portion A" represents the contribution to the overall gain transfer function of the broadband channel 24. Thus, when high-frequency components of the speech signal are relatively weak, the gain in the high-pass channel 22 is very high relative to that of the broadband channel 24, ensuring that considerable high-frequency information is effectively added to the broadband signal at the summer 26. Thus, when the speech signal is at a relatively low level, the curcuit 16 enhances the intelligibility of the processed speech signal to ensure that speech reproduced from the signal is not obscured by low-frequency background noise.

Curve B shown in stippled outline, indicates the change occurring in the gain curve A as the intensity of the high-frequency content of the speech signal rises to a relatively higher level. From FIG. 2, it will be apparent that in such circumstances, the gain of the high-pass channel 22 is reduced from the predetermined starting level indicated by the curve portion A'. Thus, the amount of high-frequency content added to the broadband signal at the summer 26 is reduced, the summer output signal is reproduced as more natural-sounding speech. Since the high-frequency content of the speech signal is at a relatively higher intensity, there is in such circumstances less likelihood that the speech signals reproduced by the speaker 14 will be obscured by low-frequency background noise.

Curve C indicates the change in the curve A occurring when the high-frequency components of the speech signal are at a very high level, at which there is little likelihood of the speech signal being obscured by low-frequency background noise. In such circumstances, the contribution of the high-pass channel 22 to the output signal produced by the summer 26 is negligible, and the gain transfer function of the circuit 16, which is effectively represented by the curve portion A" in solid outline and the curve C in stippled outline, is essentially that of a unity gain, broadband amplifier. In effect, the speech signal is simply fed forward. Since little spectral distortion is introduced into the speech signal, the speaker 14 reproduces the speech signal as naturally-sounding speech with the full range of characteristics associated with the original speech.

The overall operation of the circuit 16 is such as to enhance the intelligibility of an incoming speech signal when its high-frequency components are at a relatively low level, generally indicating that the speech signal is at a very low level and very capable at being obscured by low-frequency background noise. The speech reproduced in such circumstances tends to be rather tinny, but intelligible. As the level of the high-frequency components of the speech signal rises, less high-frequency content is added to the processed speech signal, thereby tending to retain the natural sound of the associated speech. When the high-frequency content of the speech signal is at a very high level, with little possiblity of the speech signal being obscured by low-frequency background noise, the circuitry 16 adopts a broadband mode of operation, which results in very natural sounding speech from speaker 14. Because the circuit 16 is responsive to high-frequency content of the speech signal, the circuit 16 has very large high-frequency gain at low speech signal levels and tends in such circumstances to provide a better signal-to-noise ratio unlike, for example, the prior art system proposed for hearing aids and described above.

Figure 3:
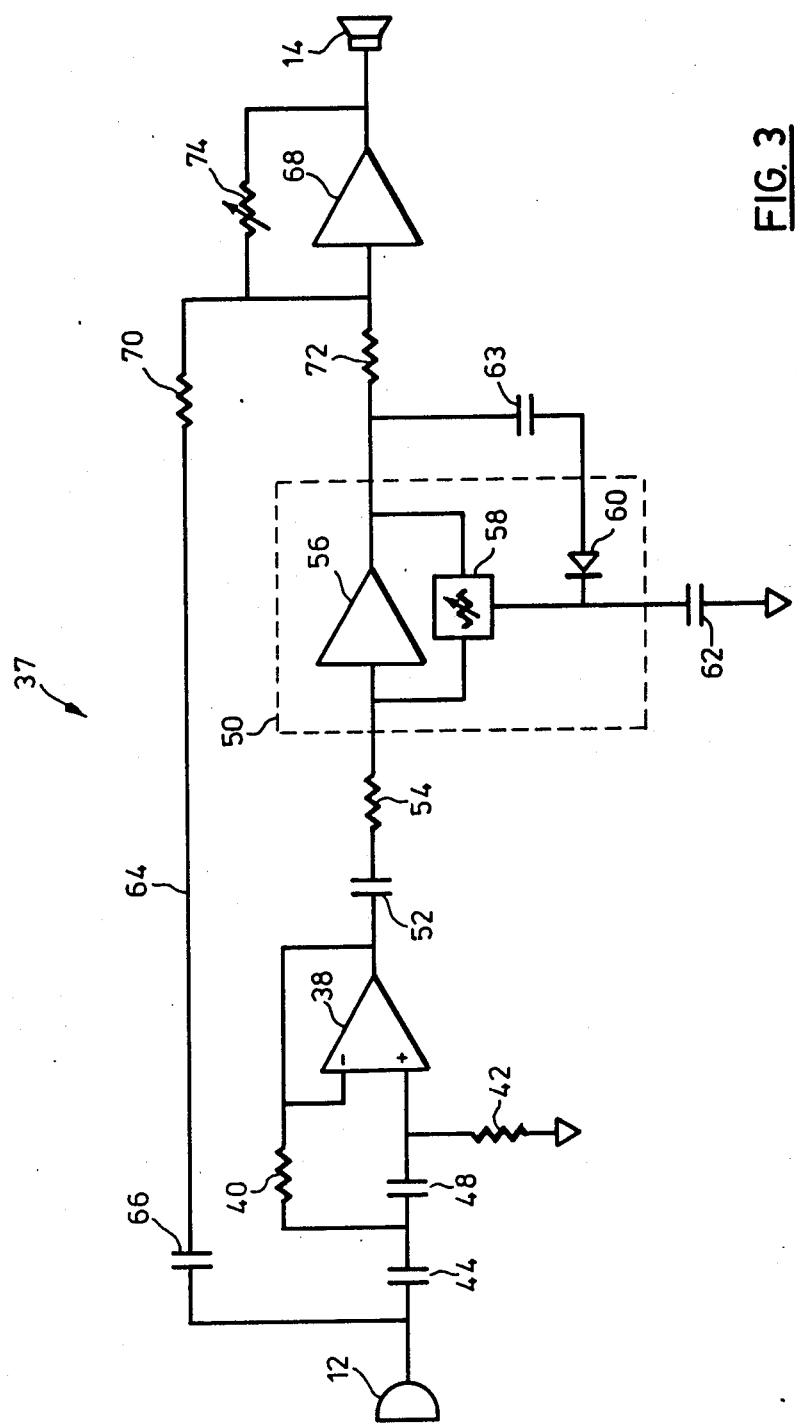
FIG. 3 schematically illustrates an electronic circuit which represents practical embodiment of the apparatus of FIG. 1.

FIG. 3 schematically illustrates a circuit 37 which is a preferred embodiment of the invention and a practical embodiment of the circuit 16. The circuit 37 is shown connected to the microphone 12 to receive a speech signal and to the speaker 14 where the processed speech signal is reproduced as sound.

The speech signal received from the microphone 12 is passed through a unity-gain high-pass filter, consisting of an operational amplifier 38 together with resistors 40, 42 and capacitors 44, 48. The high-pass filtered signal is received by an AGC amplifier, generally indicated by the reference numeral 50, through a capacitor 52 and resistor 54. The AGC amplifier 50 includes an operational amplifier 56 whose input and output terminals are connected by a voltage-controlled resistance 58. The resistance value of the voltage-controlled resistance 58 is set by a voltage derived by rectifying the output signal of the amplifier 56 with a diode 60 and filtering the rectifying signal with a capacitor 62, a large capacitor 63 serving to block any DC offset appearing at the output of the amplifier 56. The gain of the AGC amplifier 50 for high-frequency signals is essentially determined by the ratio of the resistance of the voltage-controlled resistance 58 and the resistance of the resistor 54, while the capacitor 52 together with the resistor 54, provide additional low-frequency attenuation. Although the amplifier 50 has been shown essentially as separate components, the amplifier 50 is preferably an integrated circuit AGC amplifier which is model No. LC502 manufactured by Linear Technology Inc. of Burlington, Ontario, Canada, and which is described in an article entitled "Monolithic AGC Amplifier Operates from One Volt Supply", Electronic Design, Sept. 16, 1982, P.203.

The high-pass filter described and the AGC amplifier 50 serve as the high-pass channel described in more general terms above. The broadband channel of the circuit 40 consists essentially of a feed forward line 64 containing a capacitor 66 provided to block DC from the microphone 12 without significantly affecting the spectral characteristics of the speech signal. The capacitor 66 may be eliminated if a microphone producing no DC offset is used. The broadband signal provided by the feed-forward line 64 and the high-pass signal generated by the high-pass filter and AGC amplifier 50 are combined by a summer consisting of the operational amplifier 68, input resistors 70, 72 and variable feedback resistor 74. The output signal of the summer is used to drive the speaker 14. If a large speaker is used, an appropriate driving stage can be provided following the summer.

The circuitry 16, the circuit 40 and other embodiments of the invention can be used in a variety of applications. Two such applications have been indicated above, namely, intercom and surveillance systems. Another useful application for the invention is in hearing aid amplifiers. In hearing aid applications, the roll-off frequency, the roll-off rate and the gain of the high-pass channel, and its gain can be selected or be made selectively variable to accommodate recruitment problems which will necessitate greater high-frequency gain than would normally be required by the unimpaired ear.

It will be appreciated that particular embodiments of the invention have been described and that modifications may be made therein without departing from the spirit of the invention or the scope of appended claims.

I claim:

1. Apparatus for enhancing the intelligibility of an audio-frequency electric speech signal corrupted by low frequency noise, comprising:
   (a) an input terminal for receiving said speech signal,
   (b) an output terminal,
   (c) summing means for adding together signals applied thereto to produce a sum signal, said summing means being connected to said output terminal,
   (d) a broadband channel connected between said input terminal and said summing means for producing from the speech signal a corresponding broadband signal and applying said broadband signal to said summing means,
   (e) a high-pass channel connected in parallel with said broadband channel between said input terminal and said summing means and comprising:
      (i) a high-pass filter connected to said input terminal for producing from said speech signal a high-pass signal which is substantially free of selected low-frequency components,
      (ii) an automatic gain control amplifier connected to said high-pass filter and having an output, for producing from said high-pass signal an amplified high-pass signal,
      (iii) said amplifier having a gain control terminal, and means responsive to the amplitude of a signal received at said gain control terminal for varying inversely therewith the gain of said amplifier,
      (iv) means connected to said output of said amplifier for rectifying said amplified high-pass signal and applying such rectified high-pass signal to said gain control terminal, for varying the gain of said amplifier inversely with the amplitude of said amplified high-pass signal,
      (v) the parameters of said amplifier being set such that said amplifier has substantially greater gain than that of said broadband channel when said high-pass signal is of low amplitude and such that the contribution of said amplified high-pass signal to said sum signal is small when said high-pass signal is of high amplitude, so that when said high-pass signal is of low amplitude, the contribution of said amplified high-pass signal enhances the intelligibility of said sum signal, and when said high-pass signal is of high amplitude, said sum signal will more faithfully represent natural sounding speech.

2. Apparatus according to claim 1 wherein said means responsive to the amplitude signal received at said gain control terminal comprises a voltage controlled resistance.

* * * * *